United States Patent [19]

Lemelson

[11] Patent Number: 5,040,501
[45] Date of Patent: Aug. 20, 1991

[54] VALVES AND VALVE COMPONENTS

[76] Inventor: Jerome H. Lemelson, 48 Parkside Dr., Princeton, N.J. 08540

[21] Appl. No.: 489,663

[22] Filed: Mar. 7, 1990

Related U.S. Application Data

[63] Continuation-in-part of Ser. No. 32,352, Mar. 31, 1987, Pat. No. 4,960,643.

[51] Int. Cl.$^5$ ............................................. F01L 3/00
[52] U.S. Cl. ............................ 123/188 AA; 428/408; 407/45.1
[58] Field of Search ............ 123/188 AA; 427/45.1; 428/408

[56] References Cited

U.S. PATENT DOCUMENTS

| | | | |
|---|---|---|---|
| 4,182,299 | 1/1980 | Earle et al. | 123/188 AA |
| 4,554,898 | 11/1985 | Yamada et al. | 123/188 AA |
| 4,859,493 | 8/1989 | Lemelson | 427/45.1 |
| 4,935,303 | 6/1990 | Ikoma et al. | 427/45.1 |

FOREIGN PATENT DOCUMENTS 78119  6/1980  Japan ............................ 123/188 AA Primary Examiner—E. Rollins Cross

[57] ABSTRACT

Improved valves, such as exhaust valves for internal combustion engines and other valves subject to wear and corrosion and, in certain instances, impact forces which may cause degradation in structure and structural failure. In one form, a select portion of the surface of a valve component or components subject to degradation during use such as erosive and/or corrosive effects of fluid particles and liquid or vaporous fluid passing through the valve, is coated with a synthetic diamond material which is formed in situ thereon. In another form, the entire surface of the valve component is so coated. The component may be a movable poppet member for an exhaust valve for a combustion chamber of an internal combustion piston engine. The valve seat or insert may also be coated with synthetic diamond material, particularly the circular tapered inside surface thereof against which a portion of the underside of the head of the valve poppet which engages the seat when the valve is spring closed. By coating the entire head and stem of the valve poppet with synthetic diamond and overcoating or plating a solid lubricant, such as chromium on the outer surface of the diamond coating a number of advantages over conventional valve construction are derived including better heat and corrosion resistance, reduced wear resulting from seat and valve head impact contact and a reduction in the enlargement of surface cracks. Similar improvement are effected for the valve seat when so coated and protected. In a modified form, the entire interior or selected portions of the wall of the valve body or the combustion chamber containing the valve may be coated with synthetic diamond material with or without a protective overcoating.

21 Claims, 1 Drawing Sheet

VALVES AND VALVE COMPONENTS

RELATED APPLICATIONS

This is a continuation-in-part of application Ser. No. 032,352 filed Mar. 31, 1987, now U.S. Pat. No. 4,960,643.

SUMMARY OF THE INVENTION

This invention relates to improvements in fluid valves employed to control the flow of fluids such as liquids and gases between two regions or conduits. While the improved constructions which result from the selective application of high strength carbon coatings, such as thin layers of synthetic diamond formed in situ on valve component surfaces, are applicable to most valves and valve components which are subject to erosion, corrosion and physical failure during use, in a preferred form of the invention, such improvements are are paticularly applicable to valves, such as internal combustion engine exhaust valves for use at high temperatures and subject to explosive and operational impact forces. For valve components subject to sliding friction during operation, the hard synthetic diamond film is applied to either or both surfaces of the valve head and seat therefor which ordinarily engage during valve operation and either or both engaging surfaces of the synthetic diamond coatings are overcoated with a suitable wear resistant solid lubricating material, such as chromium or other suitable material as described herein.

The hard synthetic diamond material applied to all or a select portion of the outer surface of the valve component serves a number of cooperative purposes which combine to protect the component from wear, corrosion and surface or body failure. The hard carbon layer, which is formed in situ on the valve component substrate, serves to strengthen the component and the surface stratum thereof and prevent its destruction due to surface crack formation and extension during use. The hard protective coating better distributes operational and impact loading, protects the valve component against the erosive effects of combustion particles, chemical corrosion at high temperature and wear when the components engage and move against each other. In an important form of the invention, the entire inside surface of the valve, cylinder head or combustion chamber is coated with synthetic diamond material or the like as defined herein per se or overcoated with a protective layer of chromium, vanadium, titanium, zirconium, tungsten, aluminum or oxides, carbides, nitrides or alloys thereof.

In one form, hard synthetic diamond material is coated against a select portion of a valve component, such as a poppet valve employed to control the flow of hot gas from the cylinder of an internal combustion engine. In another form, the entire poppet valve and all or a portion of the valve seat therefor are so coated. In a third form, an overcoating of protective material, such as chromium or a chromium alloy or other solid lubricant, is formed in situ against at least those portions of the valve and valve seat which engage each other during use to protect the under-coating of hard synthetic diamond material.

In yet another form, components of motorized or manually operated valves employed in gas and liquid conducting systems, such as chemical systems in which chemical corrosion and particle erosion tends to normally wear out such valve components, are coated with hard synthetic diamond material and, in certain instances, with an overcoating of chromium or chromium alloy applied to protect the synthetic diamond coating.

Accordingly it is a primary object of this invention to provide improvements in the construction of internal combustion engines including the combustion chamber walls and inlet and exhaust ports therefor and valves supported thereby.

Another object is to provide fluid valves and valve components which are stronger than conventional valves and components and have greater resistance to wear, corrosion and erosion and surface or body failure.

Still another primary object of this invention is to provide a new and improved valve assembly having high resistance to chemical corrosion and physical erosion during use.

Another object is to provide a new and improved valve component subject to chemical corrosion and/or physical erosion during use, which has superior corrosion and/or erosion resistance.

Another object is to provide a new and improved valve assembly having at least portions thereof which are subject to chemical corrosion and/or erosion during use, coated with a hard synthetic diamond material which is resistant to such chemical and erosive effects.

Another object is to provide a new and improved valve assembly having at least portions thereof which are subject to chemical corrosion and/or erosion during use, coated with a hard synthetic diamond material which is resistant to such chemical and erosive effects and wherein an overcoating of chromium or the like is applied to the synthetic diamond coating to protect same against certain erosive effects.

Another object is to provide an improved poppet valve for use in an internal combustion engine.

Another object is to provide an improved poppet valve for use in an internal combustion engine wherein a portion or the entire surface of the valve including a valve stem are coated with a synthetic diamond material which is operable to protect same against temperature and chemical corrosion.

Still another object of this invention is to provide a new and improved fluid valve having a surface portion thereof which is subject to wear during use coated with a hard synthetic diamond material.

Yet another object of this invention is to provide a new and improved fluid valve having a surface portion thereof which is subject to wear during use coated with a hard synthetic diamond material which synthetic diamond coating is overcoated with a thin layer of a dry lubricating material, such as chromium.

Another object is to provide an improved poppet exhaust valve for use in internal combustion engines wherein at least a portion of the outer surface of such valve is coated with a hard synthetic diamond material.

Another object is to provide an improved poppet valve assembly including a valve head and stem and a valve seat for seating and engaging a portion of the undersurface of the valve head, wherein the surface of the seat and the engaging portion of the undersurface of the valve head are coated with a hard synthetic diamond material.

Another object is to provide an improved poppet valve assembly including a valve head and stem and a valve seat for seating and engaging a portion of the undersurface of the valve head, wherein the surface of the seat and the engaging portion of the undersurface of the valve head are coated with a hard synthetic diamond material and overcoated with a thin protective layer of chromium.

With the above and such other objects in view as may hereinafter more fully appear, the invention consists of the novel structures, article constructions and methods described in the following specification and illustrated in the drawings, but it is to be understood that variations and modifications may be resorted to which fall within the scope of the invention as claimed without departing from the nature and spirit of the invention.

BRIEF DESCRIPTION OF THE DRAWINGS

In FIGS. 1 and 2 is shown details of a valve assembly 10 which forms parts of an internal combustion engine 20, a part of which is also shown in the form of part of a cylinder head 21 which is defined by a single casting or a plurality of castings or moldings of aluminum, steel or other suitable material such as a suitable high strength ceramic. The cylinder head 21 is shaped and machined to receive and retain an elongated sleeve 23 in an elongated bore 22 thereof, which sleeve slidably retains the stem 16 of a conventional poppet valve, such as an exhaust valve poppet 11 which, when open as in FIG. 1 allows exhaust gases to pass to the exhaust port 21E of the engine and, when closed as in FIG. 2 permits compression to take place in the cylinder head without fuel-air leakage to the exhaust port.

Figure 1:
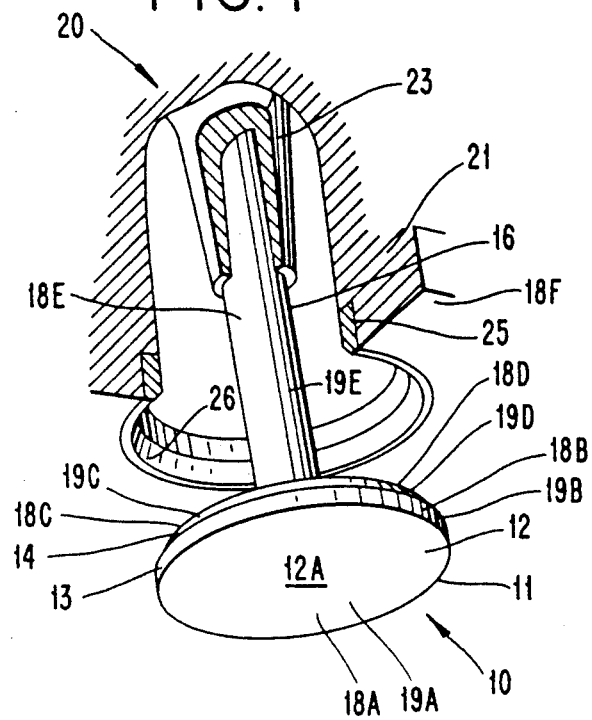
FIG. 1 is an isometric view of a poppet valve, such as an exhaust valve for an internal comustion gasoline engine, and a portion of the wall of the cylinder head of the engine including an exhaust port thereof through which the valve stem extends, illustrated by partially sectioning the cylinder head wall and illustrating the valve seat wherein all or select portions of such engine components are coated with hard protective material such as synthetic diamond.

The poppet valve 11 is formed with an elongated cylindrical stem 16 extending to a circular somewhat frusto-conically shaped head 12 which has a circular rim portion 13 extending from a tapered ed band-like conically shaped portion 14 of its side wall which is operable to sealingly engage a tapered circular portion 26 of the inside surface of a valve seat 25 secured within a bore 27 in the cylinder head casting. Suitable means including one or more springs and a valve lifter or actuator are employed to open and close the valve by moving the poppet 11 back and forth along the path defined by stem 16 in movement through the sleeve 23.

A hard synthetic diamond or diamond like material 18 is shown deposited as a thin layer or film against all the exposed or outer surfaces of one or more of the engine components shown, or against select portions thereof to protect same against the effects of corrosion, erosion and surface defect induced failure such as the severe extensions of surface cracks during operation of the engine. Such synthetic diamond material 18 may cover the entire outer surface of the poppet 11 including the stem and head 12 thereof, the head portion per se or portion 14 which engages and seals against portion 26 of the valve seat when the valve closes.

Deposited against the end face 12A of the head 11 is a layer 18A of such synthetic diamond material 18 while 18B refers to that portion of the synthetic diamond material coating the circular rim portion of the head 12; 18C to such coating the conically shaped band-like portion 14 which egages the circular taper portion 26 of the valve seat 25 when the valve is closed; 18D to such synthetic diamond material coating the remaining portion of the underside of the valve head 12 and 18E to such coating extending along and covering the valve stem 16.

Similarly formed synthetic diamond material, which may be depsoited as atoms of carbon stripped from hydrocarbon gas molecules, such as molecules of methane gas or the like by suitable microwave energy passed through such gas adjacent the surface being coated, may also be applied to the surfaces of the walls of the engine cylinder or combustion chamber and the cylinder head therefor and the inside surfaces of the exhaust and inlet ports. Notation 18F refers to that portion of synthetic diamond coating the cylinder head 21 and the inside surface of the cylinder itself; 18G to synthetic diamond coating the sleeve 23 which may comprise the entire surface thereof or just the insider surface in which the stem 16 of the valve poppet 11 slidably rides during operation of the engine and valve while 18H refers to such synthetic diamond coating the surface or surfaces of the exhaust port 21P formed in or secured to the cylinder head beyond the head 12 of the poppet 11.

In a modified and preferred form of the invention, the synthetic diamond coating 18 contains a protective overcoating 19 preferably in the form of a metal such as chromium, which may serve to protect the the outer surface or surface stratum of the synthetic diamond layer from attrition, damage and destruction due to sliding friction, loading and impact forces, heat expansion and contraction, particle scratching and erosion and the like. For example, a thin layer of chromium against the outer surface of the synthetic diamond coating 18E deposited against the cylindrical surface of the stem 16 of the poppet 11 will protect the diamond film or layer from sliding friction and scatching due to burrs and abrasive particles of combustion. A similar chromium coating disposed against the outer surface of the portion 18C of synthetic diamond material coating the tapered portion 14 of the undersurface of the poppet head 11 which impacts against the tapered circular surface 26 of the valve seat 25 when the valve closes, will serve to protect the synthetic diamond material therebeneath from frictional and imact wear and attrition, prin.arily functioning as a solid lubricant and a medium for cooperating with the synthetic diamond material therebeneath in better distributing the load due to impact and combustion forces. In turn, the synthetic diamond undercoating 18 protects the outer stratum of the metal substrate of the engine component against attrition, such as the formation and expansion of surface cracks and pits formed during casting, forging and/or machining the component or during extended use.

Since the outer surface 12A of the head 12 of the poppet 11 is is subject to direct attrition of combustion including heat, impact forces, shock waves and particle erosion caused thereby, the synthetic diamond material 18A and chromium layer 19A thereon serve to lessen or prevent the effects of such forces and erosion of the material of the surface stratum, thereby lengthening the life of the poppet and reducing the possibility of failure of the substrate metal. Notations 19B, 19C, 19D, 19E, refer respectively to those portions of the protective outer layer of chromium of the like deposited against the outersurfaces of the synthetic diamond material portions 18B, 18C, 18D, and 18E coating the rim 13, the tapered band portion 14, and the stem 16.

Synthetic diamond material 18F is shown coating the inside surfaces of the combustion chamber including but not limited to the inside surface 21S of the cylinder head 21, the exhaust port 21P and the cylinder itself (not shown). Notations 18G and 19G refer to similar synthetic diamond and chromium coatings against the valve seat or just the inner tapered circular surface 26 thereof against which the surface 14 of the valve head impacts and seats suring each cycle of operation of the engine.

Figure 2:
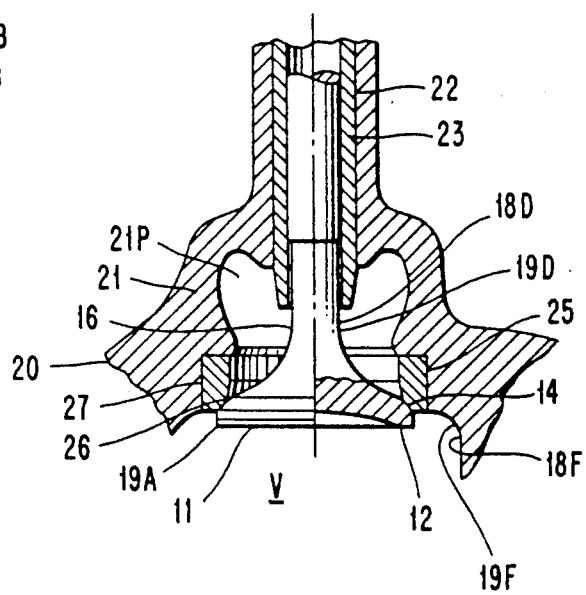
FIG. 2 is a partial side view with parts broken away and sectioned for clarity of the poppet valve, valve seat and portion of the cylinder head of FIG. 1.

Other valve components, such as employed in liquid and hot or corrosive fluid systems to regulate fluid flow, may also be coated with a similar hard synthetic diamond material coating the components 11 and 25 of FIGS. 1 and 2 and overcoated, as described, such as balls and other movable valve components which are spring urged in valve closing or opening positions against respective valve seating means, the valve springs, such as coil springs and the like, valve bodies and surface portions exposed to chemical and heat corrosion during use, valve components subject to sliding frictional wear and mechanical erosion caused by fluid movement therepast, etc. For example, the inside surface 21S of the cylinder head casting 21 adjacent the undersurface of the valve poppet member 11, which is subject to heat and temperature corrosion, may also be similarly coated with hard synthetic diamond material deposited in situ therein, as described herein, and overcoated with a thin coating or plating of chromium, chromium alloy or other suitable material employed to protect the diamond coating from scouring, erosion and chemical attack during use.

In addition to coating all or select portions of the valve actuator or poppet and the valve eat therefor with synthetic diamond material and overcoating same with chromium or other suitable protective material, other valve components such a steel coil springs for retaining the valve poppet closed, valve lifters and the like, may be similarly coated and protected from failure during use. The entire surfaces of a coil spring may be so coated with carbon atoms stripped from molecules of carbon atom containing gas by means of suitable microwave energy applied through the gas and spring.

Figure 3:
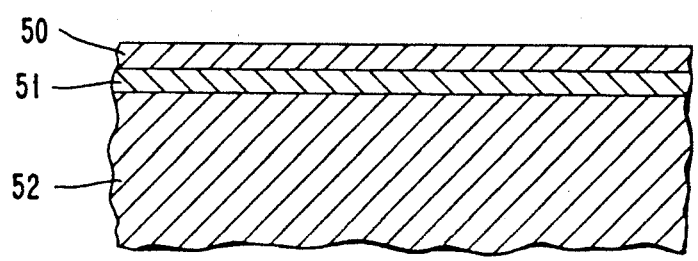
FIG. 3 shows a fragment of one of the valve components of FIGS. 1 and 2 shown in cross section to illustrate a composite coating layer(s) on the outer surface thereof.

In FIG. 3 is shown structural details of the synthetic diamond coatings, the protective overcoatings and the substrates coated. The substrate, which may be any of the configurations hereinabove described, is denoted 50 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 32,307, now U.S. Pat. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Certain modifications to the structures and methods for making same may be found in my parent application Ser. No. 32,307, now U.S. Pat. No. 4,859,493 and in pending patent application Ser. No. 032,352 filed Mar. 31, 1987, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer suface or surfaces of the articles to the exclusion of another area or areas thereof for functional and/or economic purposes. Such an electon beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/ or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surfaces(s) coatings will impart greater resistance to wear and abrasion. Surface attrition due to impact forces and loading during use may also be lessened or eliminated by such hard synthetic diamond coating(s) which may be applied as a single or plurality of layers per se or combined or overcoated with one or more layers of the described metals and/or metal alloys to lubicate and protect the surface of the synthetic diamond coating.

4. Coatings formed of a plurality of layers of synthetic diamond material formed as described between respective layers of the same or different metals such as chromium, vanadium, titanium, tungsten, metal alloys and/or ceraimic materials may be employed to enhance the physical, chemical resistance and electrical characteristics of the articles described. Such multiple coatings may also be employed to substantially enhance the strength and stiffness of the articles.

5. Certain of the articles of manufacture described above may be fabricated by compressing particles of metal, various ceramic materials or mixtures of either or both materials with fine particles of synthetic diamond produced, for example, as set forth in my U.S. Pat. No. 4,859,493 and employed to strengthen the composite. Short filaments of synthetic diamond or composites thereof sa set forth in such patent may also be mixed with such particulate material(s) to form articles of the type(s) described herein having superior substrate strength and corrosion resistence. Compression of such mixture(s) between dies with or without the addition of a resin binder while simultaneous and/or sequentially heating same to effect sintering or otherwise consolidating the metal particles into a defined shape may be effected prior to the described coating with synthetic diamond material.

6. The described articles may also be formed by compressing particulate material with resinous binder particles, then sintering at temperature to burn away the resin leaving a porous substrate of desired shape. By placing such porous substrate in a chamber containing a mixture of hydrocarbon gas and hydrogen under pressure, molecules of the gas mixture will flow into the pores or intersticies of such substrate, particularly if the chamber and substrate therein are first subjected to suitable vacuum. Thereafter by generating and directing suitable microwave energy through the gas and substrate, carbon atoms will be stripped from the gas molecules containing same and will form as synthetic diamond or diamond-like material on the surfaces of the walls of the internal interstices, thus providing a new high strength structure of select external shape which is internally reinforced with synthetic diamond material and is externally coated with such material providing a hard outer shell which is highly resistant to erosion, surface attrition, wear and chemical corrosion.

7. The term synthetic diamond material employed herein refers to high strength coatings, filaments or particles of carbon exhibiting the chemical and physical characerics (e.g. strength) of diamond. For certain of the articles and applications described above, the carbon atoms stripped from the molecules of hydrocarbon gas, such as methane, by microwave energy may form hard high strength coatings which do not quite exhibit the hardness of diamond but will suffice for many applications.

8. Certain other components of the internal combustion engine may be fabricated by one or more of the manufacturing techniques described above to produce component substrates thereof and to coat same with one or more protective coatings as described. Coil springs of the type employed to lift and move poppet valves or other components may be formed of steel or other suitable material which is precoated with synthetic diamond material with or without an overcoating of chromium or the like or may be so coated after formed into such coil springs. The substrate defining such springs or otherwise shaped springs may also be formed by the means set forth in paragraphs 5 and 6 above containing synthetic diamond material uniformly distributed throughout the matrix or substrate material wherein the surface stratum of such springs is synthetic diamond material per se or such material overcoated with chromium or one or more of the described protecting materials. Ignition points, distributor caps and rotor slides, sprak plug electrodes, control switch contacts, cylindrical and split bearings and bearing collars, electrical connectors and other vehicle components subject to high loading and impact forces, frictional wear and erosion during use may be similarly fabricated and coated as described.

What is claimed is:

1. A poppet valve component for use as part of an exhaust valve assembly in an internal combustion engine,
    (a) said valve component formed of a valve stem having an elongated cylindrical shape and a valve head of general circular shape integrally secured to an end of said valve stem,
    (b) said valve head having a downwardly facing circular surface adapted for seating engagement with a surface circumscribing an exhaust port of a combustion chamber of an internal combustion engine,
    (c) a thin layer of synthetic diamond material formed in situ on and bonded to said downwardly facing circular surface of said valve head to protect same against heat and chemical corrosion during use of said valve in the operation of an internal combustion engine.

2. A valve component in accordance with claim 1 having a hard chromium layer deposited in situ on the outer surface of said synthetic diamond material coating said circular portion of said valve head.

3. A valve in accordance with claim 1 wherein said hard synthetic diamond material is coated over said downwardly facing circular surface of said valve head in a thickness varying between 0.00001" and 0.001".

4. A valve assembly in accordance with claim 3 wherein said chromium coating on said diamond material over said downwardly facing circular portion of said valve head varies between 0.00001" and 0.001".

5. A valve component in accordance with claim 1 wherein the entire outer surface of said valve component is coated with said hard synthetic diamond material.

6. A valve assembly in accordance with claim 1 including a valve seat secured to the wall of the cylinder head of said internal combustion engine, said valve seat having a circular upwardly facing portion adapted to mate with said circular downwardly facing portion of said valve component when the valve is closed, said circular upwardly facing portion of said valve seat having a coating of synthetic diamond material deposited in situ thereon.

7. A valve assembly in accordance with claim 6 including a thin coating of chromium disposed over said coating of synthetic diamond material against the upwardly facing surface of said valve seat and integrally bonded thereto.

8. A valve assembly comprising in combination:
   (a) a first valve component defining a passageway through which a fluid may pass,
   (b) a second valve component movably supported with respect to said first valve component and operable to be moved from a closed position whereby fluid is prevented from passing through said valve to an open condition whereby fluid is allowed to pass through said valve,
   (c) a first surface portion of said second valve component being operable to engage a select portion of said first valve component when said valve is closed,
   (d) said first surface portion of said second valve component being coated with a hard synthetic diamond material operable to protect said first surface portion against erosion and corrosion during the operation of said valve.

9. A valve assembly in accordance with claim 8 including a solid lubricant overcoating said coating of hard synthetic diamond material against said first surface portion of said second valve component.

10. A valve assembly in accordance with claim 9 wherein said lubricating material coating said synthetic diamond material disposed against the first surface portion of said second valve component is a thin layer of chromium.

11. A valve assembly in accordance with claim 8 wherein said first surface portion is an annular portion of the surface of said second valve component.

12. A valve assembly in accordance with claim 8 wherein said valve is an exhaust valve for an internal combustion engine.

13. A valve assembly in accordance with claim 8 wherein said valve is an exhaust valve for a piston engine disposed in the wall of the cylinder head of said piston engine.

14. A valve assembly in accordance with claim 13 wherein said second valve component is a poppet valve member.

15. A valve assembly in accordance with claim 14 wherein said surface portion of said second valve component coated with said synthetic diamond material is a portion of a conical surface.

16. A valve assembly in accordance with claim 15 wherein said exhaust valve which is formed with a mushroom type head extending to a stem, said valve head being entirely coated with said hard synthetic diamond material.

17. A valve assembly in accordance with claim 16 wherein said synthetic diamond material coats the entire head and stem of said valve.

18. A valve assembly in accordance with claim 17 wherein said first valve component defines the seat for a portion of the surface of said second valve component, said seat having a surface portion engagable by said second valve component.

19. A valve assembly in accordance with claim 17 wherein said second valve component is entirely covered with said hard synthetic diamond material.

20. A valve for use in controlling the flow of fluid comprising:
   (a) a valve support including means for defining a passageway of the flow of fluid,
   (b) movable valve regulating means supported by said support and operable to vary the cross sections of said passageway when moved,
   (c) said valve regulating means having a first surface exposed to fluid flow through said passageway,
   (d) a coating of synthetic diamond material formed in situ on the surface of said valve regulating means exposed to said fluid.

21. A valve in accordance with claim 20 wherein said valve support includes a valve chamber, means for supporting said valve regulating means to regulate the flow of fluid passed to said valve through said chamber, said chamber defined by a surrounding wall, the interior surface of said chamber wall being coated with said synthetic diamond material.

* * * * *